United States Patent
Westerman

(10) Patent No.: US 6,310,508 B1
(45) Date of Patent: Oct. 30, 2001

(54) HIGH FREQUENCY SWITCH

(75) Inventor: Stephen J. Westerman, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/645,803

(22) Filed: Aug. 24, 2000

(51) Int. Cl.$^7$ .................................................. H03K 17/04
(52) U.S. Cl. ......................... 327/374; 327/427; 327/389; 327/432; 333/81 R
(58) Field of Search .................................. 327/362, 379, 327/382, 389, 427, 419, 432, 433, 493, 308, 374, 376, 377; 333/81 R; 330/284, 145

(56) References Cited

U.S. PATENT DOCUMENTS

| | | | |
|---|---|---|---|
| 3,731,116 | * 5/1973 | Hill | 327/374 |
| 3,800,229 | * 3/1974 | Backwinkel | 333/81 R |
| 3,813,602 | * 5/1974 | Van Dijum et al. | 333/81 R |
| 4,019,160 | * 4/1977 | Kam | 333/81 R |
| 4,494,076 | * 1/1985 | Rinderle | 333/81 R |
| 4,689,498 | * 8/1987 | Rinderle | 333/81 R |

* cited by examiner

Primary Examiner—Terry D. Cunningham
Assistant Examiner—Long Nguyen

(57) ABSTRACT

A high-frequency switch for blocking or transmitting a high frequency input signal. The switch includes a common-base transistor having an emitter, base, and collector, the emitter being connected to an input node and the base being connected to a power rail that is preferably ground. The input node is coupled to the input signal. The present invention utilizes a shunt having a switching element with closed and open states to route the input signal either to the collector of the common-base transistor or to the power rail. The switching element connects the input node to the power rail in the closed state and isolates the input node from the power rail when the switching element is in the open state. The open and closed states are selected by the application of a control signal to the switching element. A bias circuit sets the input node to be at a first bias potential when the switching element is in the open state and a second bias potential when the switching element is in the closed state. The first bias potential causes the common-base transistor to be in a conducting state, and the second bias potential causing the common-base transistor to be in a non-conducting state. The switching element may be constructed from a wide variety of circuit elements including a diode, transistor, or mechanical switch.

11 Claims, 4 Drawing Sheets

HIGH FREQUENCY SWITCH

FIELD OF THE INVENTION

The present invention relates to high frequency switches, and more particularly, to a high frequency switch that provides a high degree of isolation while maintaining a high bandwidth and economical construction.

BACKGROUND OF THE INVENTION

There are many circuit designs that require a high frequency switch. An ideal switch has very low losses in the "on" mode while providing very high losses in the "off" mode. In both modes, the switch must provide a high degree of isolation in the reverse direction. In addition, the ideal switch has a flat gain over the operating frequency range of the switch and settles quickly after being switched. Finally, cost is always a factor in switch design. The ideal switch should have a low part count and have as few control lines as possible to prevent switch-to-switch crosstalk in circuits employing multiple switches.

Mechanical switches can provide many of these desirable features. However, such switches have slow switching times and are subject to wear. Accordingly, there are many applications in which mechanical switches cannot be used.

Switches based on PIN diodes in a biased divider configuration followed by a high input impedance amplifier have also been utilized. However, these switches have unsatisfactorily high losses in the "on" state and/or insufficient losses in the "off" state to provide the needed on/off switching ratio for many applications. In addition, these switches generate harmonic distortions. Finally, these switches have a high part count that makes them commercially unattractive for many applications.

Broadly, it is the object of the present invention to provide an improved high frequency switch.

It is a further object of the present invention to provide a high frequency switch that more nearly resembles the ideal switch discussed above than prior art switches.

These and other objects of the present invention will become apparent to those skilled in the art from the following detailed description of the invention and the accompanying drawings.

SUMMARY OF THE INVENTION

The present invention is a high-frequency switch for blocking or transmitting a high frequency input signal. The switch includes a common-base transistor having an emitter, base, and collector, the emitter being connected to an input node and the base being connected to a power rail that is preferably ground. The input node is coupled to the input signal. The present invention utilizes a shunt having a switching element with closed and open states to route the input signal either to the collector of the common mode transistor or to the power rail. The switching element connects the input node to the power rail in the closed state and isolates the input node from the power rail when the switching element is in the open state. The open and closed states are selected by the application of a control signal to the switching element. A bias circuit sets the input node to be at a first bias potential when the switching element is in the open state and a second bias potential when the switching element is in the closed state. The first bias potential causes the common-base transistor to be in a conducting state, and the second bias potential causing the common-base transistor to be in a non-conducting state. The switching element may be constructed from a wide variety of circuit elements including a diode, transistor, or mechanical switch.

DETAILED DESCRIPTION OF THE INVENTION

Figure 2:
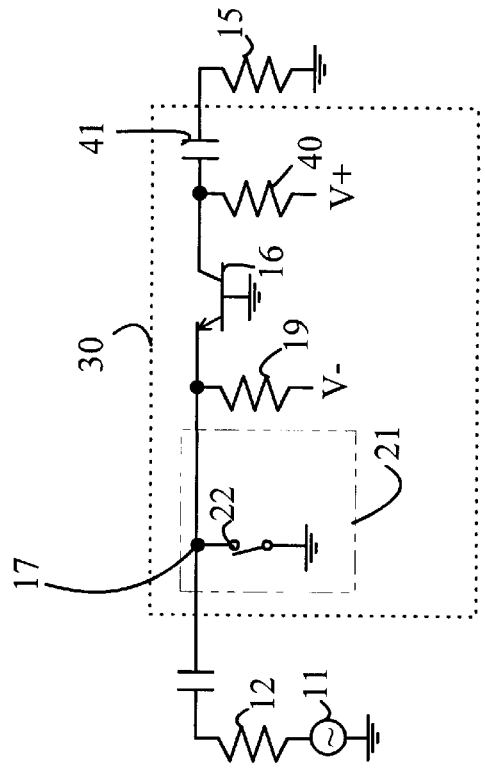
FIGS. 1 and 2 are schematic drawings of two high frequency switches 10 and 30 according to the present invention
Figure 1:
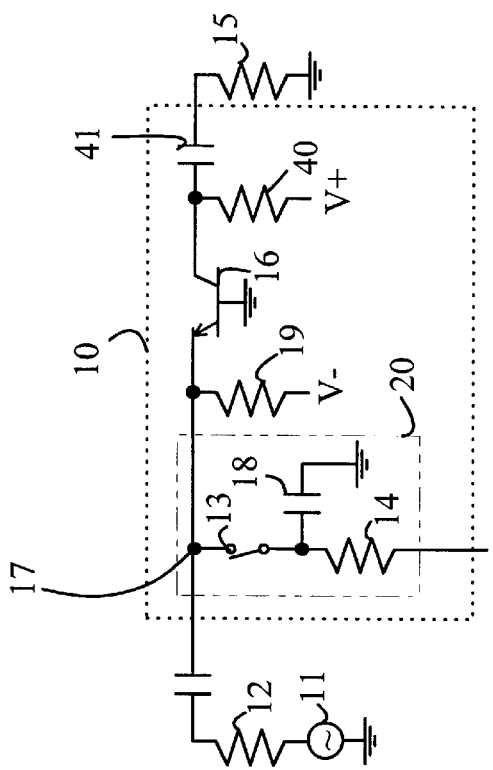

The manner in which the present invention provides its advantages may be more easily understood with reference to FIGS. 1 and 2, which are schematic drawings of two high frequency switches 10 and 30 according to the present invention. To simplify the following discussion, elements that serve the same functions are given the same numeric designations in the drawings. Each switch is assumed to be connected to a signal source 11 having a source impedance represented by resistor 12. In addition, each switch is assumed to be driving a load represented by resistor 15.

Each switch is constructed from a common-base transistor 16 whose conductivity is determined by the potential on node 17. The potential on node 17 is controlled by a shunt and a bias chain represented by resistor 19 and voltage source V-. The configuration shown in FIG. 1 will be referred to as a "high-side" shunt. In general, the high-side shunt 20 injects current into node 17 that is sufficient to bring node 17 up to 0 volts or slightly above when switch 13 is closed and switch 10 is then in the "off" state. In this state, transistor 16 is in the non-conducting state, and the signal from source 11 is shunted to ground through capacitor 18. When switch 13 is open, node 17 will be biased to a negative potential and transistor 16 will be in the conducting state. This corresponds to switch 10 being in the "on" state.

In general, the collector of transistor 16 must be biased and the load must be DC decoupled to prevent the bias voltage from reaching load 15. A resistor 40 and capacitor 41 provide the required collector bias. To simplify the remaining drawings, this bias network will be omitted.

Referring now to FIG. 2, this configuration of switch 30 will be referred to as a "low-side" shunt 21. In general, a low-side shunt grounds node 17 via switch 22 when switch 30 is in the "off" state. When switch 30 is to be placed in the "on" state, switch 22 is opened, and node 17 is biased to a potential below 0.

The attenuation ratio provided by either switch configuration depends on the source and load impedances as well as the characteristics of the shunt path and common-base transistor. It can be shown that the attenuation ratio is approximately given by the ratio of the impedance of the switch in the shunt path when the switch is closed to the source impedance, times the ratio of the load impedance to the impedance of the common-base transistor in the non-conducting state. Embodiments of the present invention having attenuation ratios of more than 60 dB at 2.5 Ghz have been demonstrated.

Figure 4:
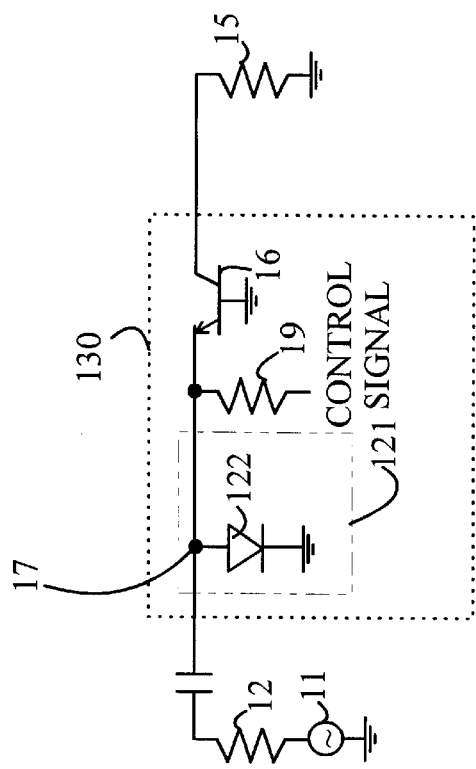
FIGS. 3 and 4 are embodiments of the present invention that utilize diodes for the switching element.
Figure 3:
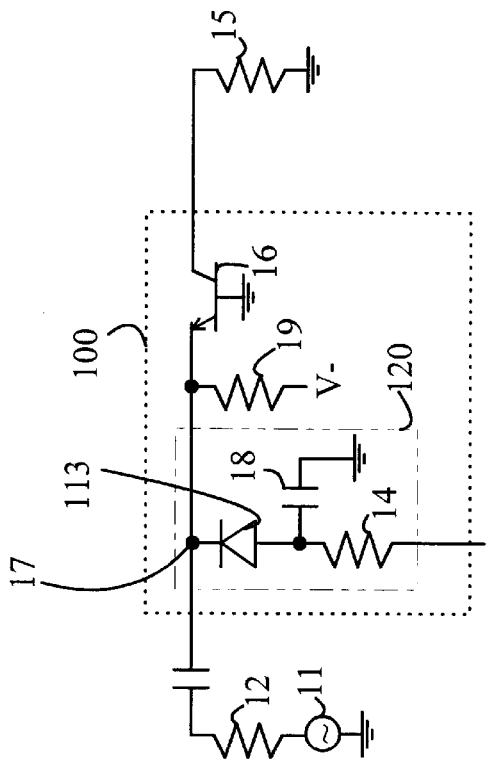

The shunt switches can be constructed from a wide range of circuit elements. In the preferred embodiment of the present invention the shunt switches 13 and 22 are PIN diodes; however other forms of diodes such as P-N and Schottky diodes may be utilized. Embodiments of the present invention that utilize diodes are shown in FIGS. 3 and 4 at 100 and 130. Switch 100 is a high-side embodiment that utilizes shunt 120, and switch 130 is a low-side embodiment that utilizes shunt 121. The conductivity of the diodes shown at 113 and 122 is controlled via a control signal. Referring to FIG. 3, when the control signal is more positive than node 17, diode 113 will conduct and switch 100 will be in the off state. The control voltage is chosen such that node 17 will be brought up to 0 volts. When the control signal becomes negative with respect to potential on node 17, diode 113 will cease to conduct, and switch 100 will be in the on state.

Figure 6:
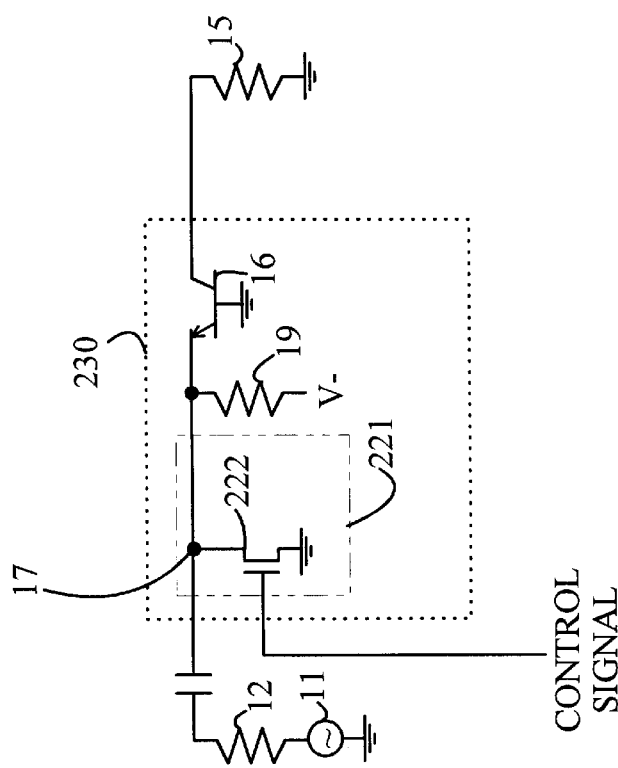
FIGS. 5 and 6, are schematic drawings of two further embodiments of the present invention that utilize field effect transistors (FETs) for the shunt switching elements.
Figure 5:
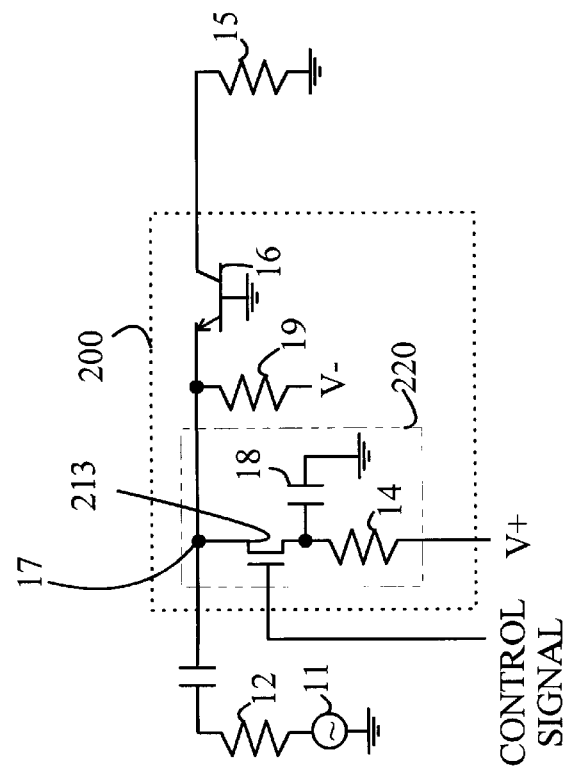

Refer now to FIGS. 5 and 6, which are schematic drawings of two further embodiments of the present invention that utilize field effect transistors (FETs) 213 and 222 for the shunt switching elements 13 and 22 shown in FIGS. 1 and 2. Shunt 220 shown in FIG. 5 is a high-side shunt, and shunt 221 shown in FIG. 6 is a low-side shunt.

Figure 8:
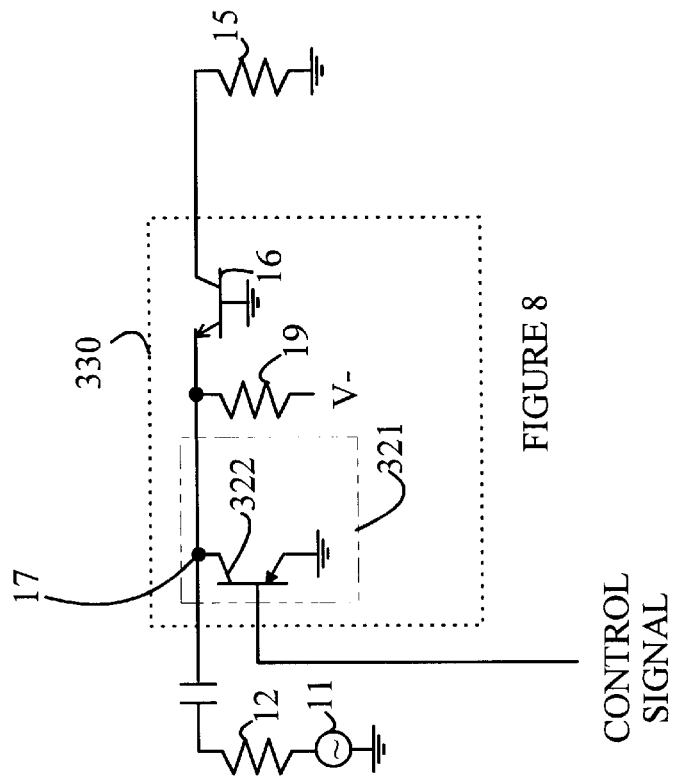
FIGS. 7 and 8 illustrate high-side and low-side shunts that utilize NPN and PNP transistors for the shunt switching elements.
Figure 7:
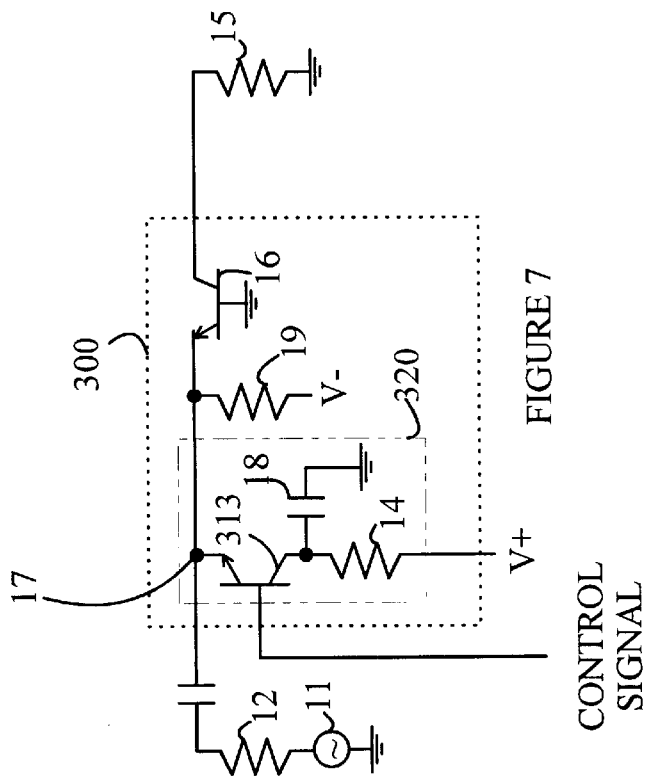

FIGS. 7 and 8 illustrate high-side and low-side shunts that utilize conventional junction transistors 313 and 322 for the shunt switching elements 13 and 22 shown in FIGS. 1 and 2. Shunt 320 shown in FIG. 7 is a high-side shunt, and shunt 321 shown in FIG. 8 is a low-side shunt. It will be obvious to those skilled in the art from the preceding discussion that similar circuits can be constructed using PNP and NPN transistors, respectively.

Various modifications to the present invention will become apparent to those skilled in the art from the foregoing description and accompanying drawings. Accordingly, the present invention is to be limited solely by the scope of the following claims.

What is claimed is:

1. A high-frequency switch for blocking or transmitting an input signal, said switch comprising:

a common-base transistor having an emitter, base, and collector, said emitter being connected to an input node, said base being connected to a power rail, wherein said input node is coupled to said input signal;

a shunt comprising a switching element having closed and open states, said switching element connecting said input node to said power rail in said closed state and isolating said input node from said power rail when said switching element is in said open state, said open and closed states being selected by the application of a control signal to said switching element; and a bias circuit for causing said input node to be at a first bias potential when said switching element is in said open state and a second bias potential when said switching element is in said closed state, said first bias potential causing said common-base transistor to be in a conducting state, and said second bias potential causing said common-base transistor to be in a non-conducting state.

2. The switch of claim 1, wherein said shunt further comprises a capacitor in series between said switching element and said power rail, said capacitor providing a conducting path for said input signal.

3. The switch of claim 1, wherein said switching element comprises a mechanical switch.

4. The switch of claim 1, wherein said switching element comprises a diode.

5. The switch of claim 4, wherein said diode is a P-N diode.

6. The switch of claim 4, wherein said diode is PIN diode.

7. The switch of claim 4, wherein said diode is a Schottky diode.

8. The switch of claim 1, wherein said switching element comprises a transistor.

9. The switch of claim 8, wherein said transistor is a field effect transistor.

10. The switch of claim 9, wherein said transistor is a NPN transistor.

11. The switch of claim 10, wherein said transistor is a PNP transistor.

* * * * *